United States Patent [19]
Yoshida

[11] Patent Number: 4,952,825
[45] Date of Patent: Aug. 28, 1990

[54] SEMICONDUCTOR INTEGRATED CIRCUIT HAVING SIGNAL LEVEL CONVERSION CIRCUIT

[75] Inventor: Hiroshi Yoshida, Tokyo, Japan

[73] Assignee: NEC Corporation, Tokyo, Japan

[21] Appl. No.: 322,787

[22] Filed: Mar. 13, 1989

[30] Foreign Application Priority Data

Mar. 14, 1988 [JP] Japan ................................. 63-60858

[51] Int. Cl.[5] .................. H03K 5/02; H03K 17/08;
   H03K 17/28; H03K 17/284
[52] U.S. Cl. .................................... 307/475; 307/450;
   307/296.3; 307/270; 307/264; 357/23.8;
   357/23.11; 357/23.12; 365/226
[58] Field of Search ............... 307/448, 481, 450–452,
   307/443, 542, 544, 585, 576, 579, 264, 298, 313,
   296.3, 279, 475, 568; 357/23.7, 23.11, 23.8,
   23.12; 365/104, 226

[56] References Cited

U.S. PATENT DOCUMENTS

| 4,441,035 | 4/1984 | Demetriou | 307/475 X |
| 4,469,959 | 9/1984 | Luke et al. | 307/475 X |
| 4,469,960 | 9/1984 | Raghunathan | 307/475 X |
| 4,482,824 | 11/1984 | Tzeng | 307/468 X |
| 4,716,313 | 12/1987 | Hori et al. | 307/475 |

*Primary Examiner*—Stanley D. Miller
*Assistant Examiner*—David R. Bertelson
*Attorney, Agent, or Firm*—Helfgott & Karas

[57] ABSTRACT

A semiconductor integrated circuit having a signal level converter is disclosed. The converter includes a plurality of first insulated gate field effect transistors each having a thin gate insulating film and formed on a low voltage or a ground voltage line side and a plurality of second insulated gate field effect transistors each having a thick gate insulating film and formed on a high voltage power supply line side.

19 Claims, 2 Drawing Sheets

SEMICONDUCTOR INTEGRATED CIRCUIT HAVING SIGNAL LEVEL CONVERSION CIRCUIT

BACKGROUND OF THE INVENTION

1. Field of the Invention

The present invention relates to a semiconductor integrated circuit having insulated gate field effect transistors (hereinafter called as IGFET's in plural case and as IGFET in singular case), and more particularly, to the integrated circuit having a structure and a circuit suitable for a high voltage operation.

2. Description of Related Art

In a conventional semiconductor integrated circuit combining, for high voltage operation, a signal level conversion circuit which is operated by multi-power supply voltages except the ground voltage, all the gate insulating films of the IGFET's used in the circuit have had the same thickness one another. Therefore, for operating the IGFET connected to the high voltage line side, a current path between the high voltage line and a ground line including a resistor must be provided so that a voltage drop induced in the resistor by allowing a current flow through the current path is applied to the gate electrode to render the IGFET in the conductive state. According to the circuit, the gate insulating film of the IGFET having a thin thickness as other IGFET's connected to the low voltage line side, is not fetally destroyed.

According to such conventional structure, however, the current must be kept to flow during the whole period in which the IGFET on the high voltage line side is in the conductive state. Therefore, the power consumption becomes inevitably large. To reduce the power consumption by minimizing the current, the resistance value of the resistor must be increased. However, in this case, the time for charging the gate capacitance of the IGFET on the high voltage line side is prolonged and the switching speed thereof is unfavorably delayed.

SUMMARY OF THE INVENTION

Accordingly, it is an object of the present invention to provide a semiconductor integrated circuit for operating with a high power voltage which consumes a reduced power and performs a high switching speed.

According to one feature of the present invention, there is provided a semiconductor integrated circuit which comprises a reference voltage line for supplying a reference voltage, a first power supply line for supplying a first voltage, a second power supply line for supplying a second voltage higher voltage level than the first voltage from the reference voltage, a first circuit connected between the first power supply voltage line and the reference voltage line so as to be driven by the voltage difference between the first voltage and the reference voltage, a second circuit connected between the second power supply voltage line and the reference voltage line so as to be driven by the voltage difference between the second voltage and the reference voltage, means for supplying a signal from the first circuit to the second circuit, and means for outputting a signal from the second circuit, the second circuit including a plurality of first IGFET's each having source and drain regions, a first gate insulating film and a gate electrode to which the signal from the first circuit is applied, and a plurality of second IGFET's each having source and drain regions, a second gate insulating film having a thickness thicker than that of the first gate insulating film and a gate electrode, and a node connected to one of the source and drain regions of one of the first IGFET's, to one of the source and drain regions of one of the second IGFET's and to the means for outputting the signal.

According to other feature of the present invention, there is provided a semiconductor integrated circuit which comprises a reference voltage line for supplying a reference voltage, a power supply line for supplying a high voltage, a signal level conversion circuit connected between the power supply line and the reference voltage line so as to be driven by the voltage difference between the high voltage and the reference voltage, first means for sending an input signal of either a low voltage state or a high voltage state into the signal level conversion circuit, and second means for leading out an output signal of either a low voltage state or a high voltage state from the signal level conversion circuit in response to the input signal, the high voltage state in the output signal being higher level than the high voltage state in the input signal, the signal level conversion circuit includes a first node, a second node connected to the second means for leading out the output signal, a first IGFET having a source-drain path connected between the first node and the reference voltage line, a gate insulating film of a first thickness and a gate electrode connected to the first means so as to be applied the input signal, a second IGFET having a source-drain path connected between the second node and the reference voltage line, a gate insulating film of the first thickness and a gate electrode connected to the first means so as to be applied the input signal, a third IGFET having a source-drain path connected between the power supply line and the first node, a gate insulating film of a second thickness thicker than the first thickness and a gate electrode, a fourth IGFET having a source-drain path connected between the power supply line and the second node, a gate insulating film of the second thickness and a gate electrode, means for connecting the first node and the gate electrode of the fourth transistor, and means for connecting the second node and the gate electrode of the third transistor.

According to another feature of the present invention, there is provided a semiconductor integrated circuit which comprises a reference voltage line for supplying a reference voltage, a first power supply line for supplying a first voltage, a second power supply line for supplying a second voltage higher level than the first voltage from the reference voltage, a circuit connected between the first power supply voltage line and the reference voltage line so as to be driven by the voltage difference between the first voltage and the reference voltage, a first node, a second node, an output node, a first IGFET having a source-drain path connected between the first node and the reference voltage line, a gate insulating film and a gate electrode, a second IGFET having a source-drain path connected between the second node and the reference voltage line, a gate insulating film and a gate electrode, a third IGFET having a source-drain path connected between the output node and the reference voltage line, a gate insulating film and a gate electrode, a fourth IGFET having a source-drain path connected between the second power supply line and the first node, a gate insulating film thicker than that of the gate insulating film of respective the first to third IGFET's and a gate electrode, a fifth IGFET having a source-drain path connected between the second power supply line and the second node, a gate insulating film thicker than that of the gate insulating film of respective the first to third IGFET's and a gate electrode, a sixth IGFET having a source-drain path connected between the second power supply line and the output node, a gate insulating film thicker than that of the gate insulating film of respective the first to third IGFET's and a gate electrode, a first means for connecting the first node and the gate electrode of the fifth IGFET, a second means for connecting the second node and the gate electrode of the fourth IGFET, a third means for connecting the second node and the gate electrode of the sixth IGFET, a fourth means for outputting an output signal from the output node, a fifth means for supplying a first signal from the circuit to the gate electrode of the first IGFET, a sixth means for supplying the first signal from the circuit to the gate electrode of the third IGFET, and a seventh means for supplying a second signal from the circuit to the gate electrode of the second IGFET. Each of the first and second signals includes a high voltage state and a low voltage state, and the output signal includes a high voltage state higher level than the high voltage state in the first and second signals, and a low voltage state. Generally, the reference voltage is a ground voltage and the reference voltage line is a ground line, and the circuit, through which the signal voltage level is enhanced, is a signal level conversion circuit. The output signal from the circuit connecting between the high voltage power supply line and the reference voltage line may be a signal to drive a fluorescent display, an electroluminescent display, etc., and therefore, the second voltage in the second power supply line is favorably 40 volts or more, or ranges favorably from 40 volts to 300 volts so that the signal outputting from the circuit is either a high state of 40 to 300 volts or a low state of the ground voltage, that is, 0 (zero) volt, or near the ground voltage. On the other hand, the first voltage driving the (first) circuit is favorably 10 volts or less. If the first voltage is 5 volts as a usual Vcc, the signals sending from the circuit to the signal level conversion circuit is either a high state of 5 volts or a low state of substantially 0 (zero) volts. Accordingly, the thickness of the gate insulating film of the IGFET on the high voltage line side is favorably 1500 Å (angstroms) or more, more particularly ranges from 2500 Å to 7000, and the thickness of the gate insulating film of the IGFET on the low voltage line side or the ground voltage side is favorably 700Å or less. Concretely, when the reference voltage is the ground voltage and the first and second voltages are positive low and high voltages, respectively, the IGFET's on the positive low voltage line side or the ground line side are of N channel type and have the thin gate insulating films, and the IGFET's on the positive high voltage line side are of P channel type and have the thick gate insulating films. In this case, the N-channel and P-channel types IGFET's can be formed in a CMOS type fashion on a semiconductor substrate.

EXPLANATION OF A PRIOR ART

Figure 1:
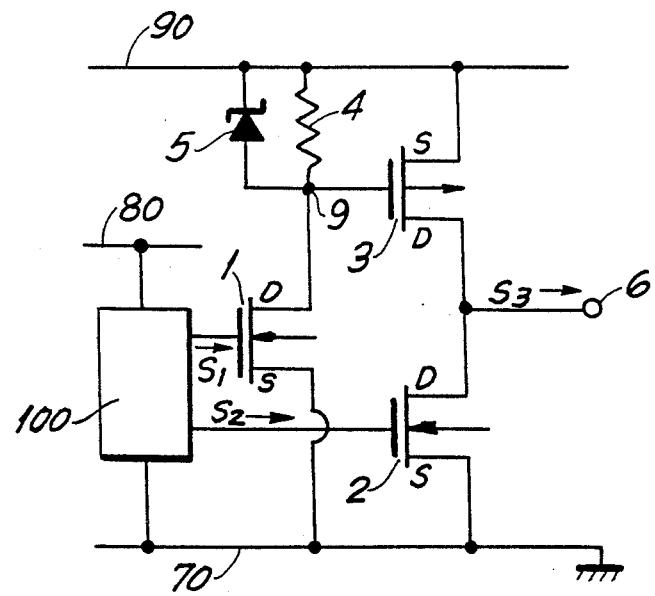
FIG. 1 is a circuit diagram showing a signal level conversion circuit in a prior art.

Referring to FIG. 1, a conventional signal level conversion circuit will be explained. A circuit section 100 is coupled to a first power supply line 80 supplying a positive low voltage of +5 volts and to a ground line 70 as a reference voltage line supplying 0 (zero) volts so as to be driven by the voltage difference of 5 volts, and a signal level conversion circuit including first, second and third IGFET's 1, 2, 3, a resistor 4 and a Zenor diode (ZD) 5, is coupled to a second power supply line 90 supplying a positive high voltage of +200 volts and to the ground line 70 so as to be driven by the voltage difference of 200 volts. The first and second IGFET's 1, 2 are of N-channel type and have the gate insulating film of 500 Å thickness and the threshold voltage of +1.0 volt, and the third IGFET 3 is of P-channel type and has the gate insulating film also of 500 Å thickness and the threshold voltage of −1.0 volt. In FIG. 1, the source region of each IGFET is represented by "S" and the drain region by "D". Further, these IGFET's may be so-called off-set gate type drain structure in which a high voltage applied to the drain region is cut-off in an elongated drain portion by a depletion layer so as to not appear near the gate structure. Moreover, the first IGFET 1 may do a role for limiting a current flowing through the resistor 4 from the positive high voltage line 90 to the ground line 70. The Zenor diode 5 is provided to limit the voltage applying to the gate electrode of the third IGFET 3. First and second signals $S_1$, $S_2$ of either a high state of +5.0 volts or a low state of 0 (zero) volts are sent from the circuit section 100 to the gate electrodes of the first and second IGFET's 1, 2, respectively, and an output signal $S_3$ of either a high state of +200 volts or a low state of 0 (zero) volts is outputted to the terminal 6 of the signal level conversion circuit. Namely, when the first signal $S_1$ is +5.0 volts to render the first IGFET in the conductive state (ON), the second signal $S_2$ is 0 (zero) volts to render the second IGFET 2 in the non-conductive state (OFF). A current flows from the positive high voltage line 90 to the ground line of 0 (zero) volts through the resistor 4 and the first IGFET 1. Therefore, a voltage of 5 volts is dropped in the resistor 4, that is, between the line 90 and a node 9, and the P-channel type third IGFET 3 is rendered in the conductive state (ON). Thus, the output signal $S_3$ becomes +200 volts. Contrary, when the first signal $S_1$ is 0 (zero) volts to render the first IGFET 1 in the non-conductive state (OFF), the second signal $S_2$ is +5.0 volts to render the second IGFET 2 in the conductive state (ON). In this case, no current flows through the current path including the resistor 4, and the output signal $S_3$ becomes 0 (zero) volts.

The current continues to flow during the whole period of the conductive state (ON) of the IGFET 1 and IGFET 3, that is, during the output signal $S_3$ being +200 volts. Therefore, a large power consumption of the IC is inevitably caused. For example, when the resistance value of the resistor is 50 KΩ, a current of 0.1 mA is flown and the power consumption in one circuit shown in FIG. 1 becomes 0.02 W in the whole ON period. When the thirty-two circuits of FIG. 1 are provided in one IC device, a power of 0.64 W is consumed in the IC device. On the other hand, if the resistance value of the resistor 4 is reduced to 10 KΩ to enhance the switching speed, the current is further increased up to 0.5 mA. Consequently, a large power of 0.1 W is consumed in one circuit shown in FIG. 1, and 3.2 W in one IC device if thirty-two circuits are provided therein.

DESCRIPTION OF AN EMBODIMENT

Figure 2:
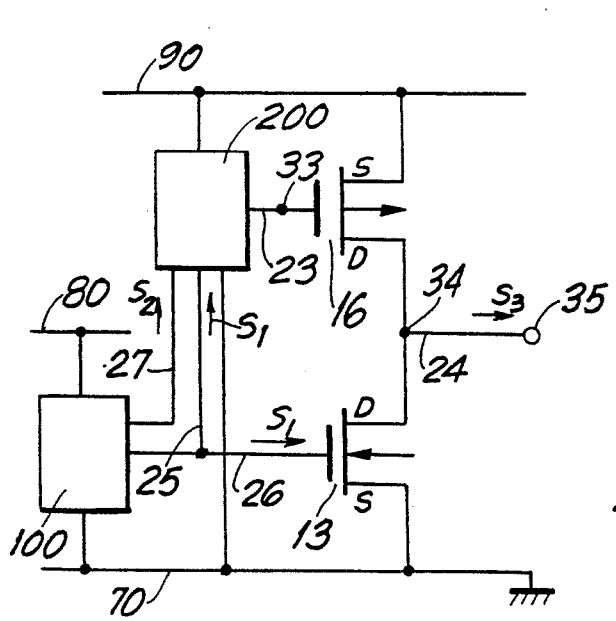
FIG. 2 is a circuit diagram showing an embodiment of the present invention.
Figure 2A:
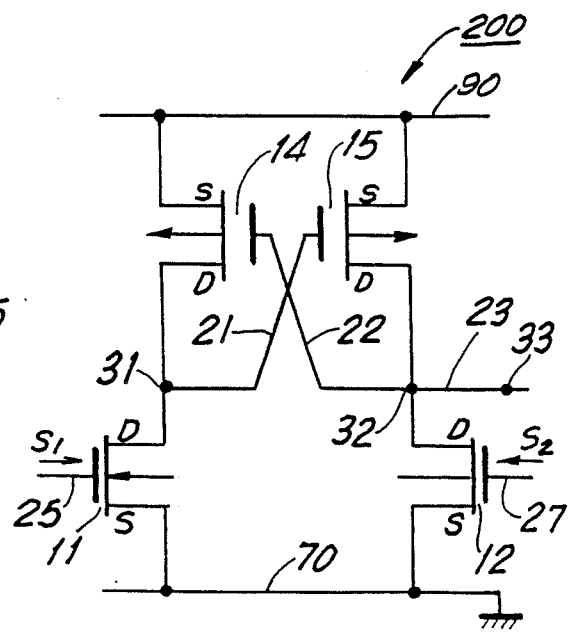
FIG. 2A is a circuit diagram representing a part 200 in FIG. 2 of the embodiment.

Referring to FIG. 2 and 2A, the same components as those in FIG. 1 are indicated by the same reference numerals, and the source region in each IGFET is represented by "S" and the drain region by "D". FIG. 2A shows a signal level conversion circuit 200 of the embodiment.

First, second and third IGFET's 11, 12, 13 are of N-channel type and have the gate insulating film of 500 Å thickness and the threshold voltage of +1.0 volt. On the other hand, fourth, fifth and sixth IGFET's 14, 15, 16 are of P-channel type and have the gate insulating film of 4000 Å thickness and the threshold voltage of −10 volts. The first and second IGFET's 11, 12 are connected to the 0 (zero) voltage line (ground line) 70 at their source regions and the fourth and fifth IGFET's 14, 15 are connected to the +200 volts line 90 at their source regions. The drain regions of the first and fourth IGFET's 11, 14 are connected to a first node 31, and the drain regions of the second and fifth IGFET's 12, 15 are connected to a second node 32. Further, the gate electrode of the fifth IGFET 15 is connected to the first node 31 by a wiring as a first connecting means 21 and the gate electrode of the fourth IGFET 14 is connected to the second node 32 by a wiring as a second connecting means 22 to constitute a flip-flop circuit. The gate electrode of the sixth IGFET 16 is connected to the second node 32 through a node 33 by a wiring as a third connecting means 23. The node 33 in the third connecting means 23 can be regarded as an output node of the signal level conversion circuit shown in FIG. 2A. The source region of the third IGFET 13 is connected to the ground line 70 and the source region of the sixth IGFET 16 is connected to the +200 volts line 90. The drain region of the third IGFET 13 and the drain region of the sixth IGFET 16 are commonly connected at an output node 34 by wirings, and the output node 34 is connected to an output terminal 35 of the IC device by a wiring as a fourth connecting means 24. From the circuit 100 which is coupled to the +5 volts line 80 and to the 0 (zero) volt line 70 and is driven by the voltage difference of 5 volts between the lines, a wiring as a fifth connecting means 25 is led-out and connected to the gate electrode of the first IGFET 11 to send a first signal $S_1$ from the circuit 100 to the gate electrode. The first signal $S_1$ is also sent to the gate electrode of the third IGFET 13 by a wiring as a sixth connecting means 26 connected to the gate electrode. Also, a wiring as a seventh connecting means 27 is ledout from the circuit 100 and connected to the gate electrode of the second IGFET 12 to send a second signal $S_2$ from the circuit 100 to the gate electrode.

Figure 3A:
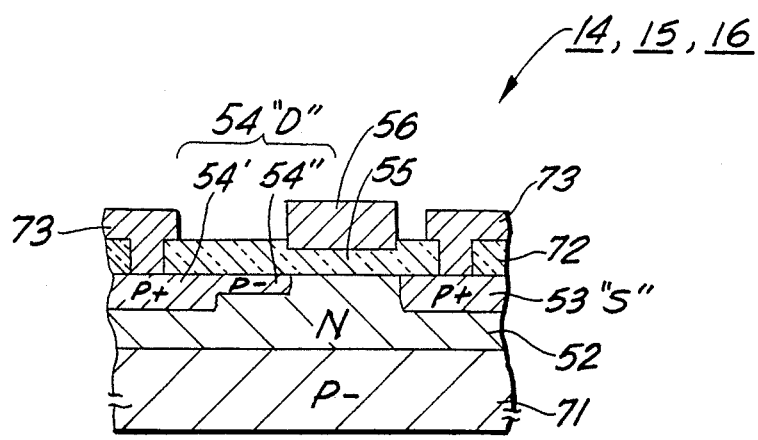
FIGS. 3A and 3B are cross-sectional view showing schematically IGFET's used in the embodiment of the present invention.
Figure 3B:
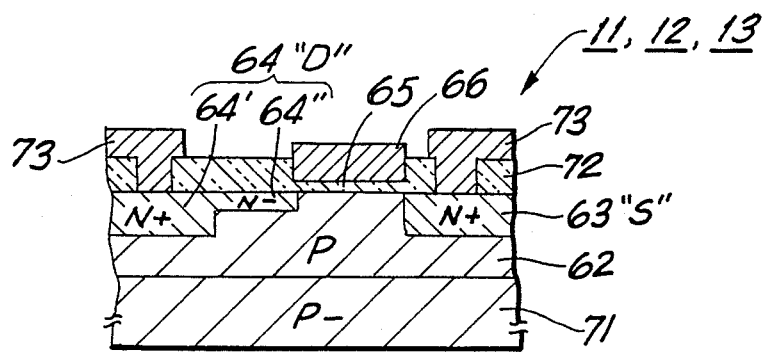

Referring to FIGS. 3A and 3B, the IGFET's used in FIGS. 2 and 2A will be explained. As shown in FIG. 3A, each of the P-channel type IGFET's 14, 15, 16 comprises P-type source and drain regions 53, 54 formed in an N-type well 52 which is in turn formed in a P⁻-type silicon substrate 71, a silicon oxide gate insulating film 55 of 4,000 Å (angstroms) thickness formed on a channel region between the source and drain regions, and a gate electrode 56 formed on the gate insulating film 55. Wirings 73 are connected to the source and drain regions through contact holes provided in an insulating layer 72, respectively. The drain region 54 consists of a P⁺-type impurity region 54' to which the wiring 73 is connected and a P⁻-type impurity region 54" extending from the region 54' to the channel region with an impurity concentration lower than that of the region 54' and a PN junction, that is, the depth shallower than that of the region 54' so that the drain region 54 constitutes an off-set gate type drain structure. As shown in FIG. 3B, each of the N-type IGFET's 11, 12, 13 comprises N-type source and drain regions 63, 64 formed in a P-type well 62 which is formed in the same substrate 71 as in FIG. 3A, a silicon oxide gate insulating film 65 of 500 Å thickness formed on a channel region between the source and drain regions, and a gate electrode 66 formed on the gate insulating film 65. Wirings 73 are connected to the source and drain regions through contact holes provided in an insulating layer 72, respectively. As in the P-channel type IGFET of FIG. 3A, the N-type drain region 64 of the N-channel type IGFET has an off-set gate type drain structure consisting of an N⁺-type impurity region 64' to which the wiring 73 is connected and an N⁻-type impurity region 64" extending from the N⁺-type impurity region 64', facing to the channel region and having a lower impurity concentration than that of the region 64' and a shallower PN junction or depth than that of the region 64'. The off-set gate type structure has a strong resistance against a high voltage applied to the drain region. The P-channel IGFET and the N-channel IGFET may constitute a CMOS structure.

Returning to FIGS. 2 and 2A, when the first signal $S_1$ is a low state of 0 (zero) volts to render the first IGFET 11 in the non-conductive state (OFF), the second signal $S_2$ is a high state of +5 volts to render the second IGFET 12 in the conductive state (ON). Therefore, the fourth IGFET 14 is rendered in the conductive state (ON); the fifth IGFET 15 is rendered in the non-conductive state (OFF); the second node 32 becomes a low state of 0 (zero) volts. The 0 (zero) volts produced at the second node 32 is sent to the gate electrode of the sixth IGFET 16 to render the IGFET 16 in the conductive state (ON). The third IGFET 13 is rendered in the non-conductive state (OFF) by the first signal $S_1$ of the low state (0 (zero) volts). Therefore, the output signal $S_3$ of a high state with a high level of +200 volts is produced at the node 34 and sent to the terminal 35.

On the other hand, when the first signal $S_1$ is a high state of +5 volts to render the first IGFET 11 in the conductive state (ON), the second signal $S_2$ is a low level of 0 (zero) volts to render the second IGFET 12 in the non-conductive state (OFF). Therefore, the fourth IGFET 14 is rendered in the non-conductive state (OFF); the fifth IGFET 15 is rendered in the conductive state (ON); the second node 32 becomes a high state of +200 volts. The +200 volts produced at the second node 32 is sent to the gate electrode of the sixth IGFET 16 to render the IGFET 16 in the non-conductive state (OFF). The third IGFET 13 is rendered in the conductive state (ON) by the first signal $S_1$ of the high state of +5 volts. Therefore, the output signal $S_3$ of a low level of 0 (zero) volts is produced at the node 34 and sent to the terminal 35.

According to the present invention, the current path including the resistor in the prior art structure shown in FIG. 1 is not necessary, and only at the transient time of the switching action a small power is consumed. Namely, in the operation of the embodiment, the current flows only at the instant of ON/OFF of each IGFET and does not flow after the change-over of the signal. In other words, a so-called "complementary MOS operation" is effected. Therefore, the power consumption is greatly reduced. Practically the power consumption in the circuit of the embodiment is reduced to about one tenth of that in the prior art circuit of FIG. 1 (as compared with 50 KΩ resistor 4). Further, a high switching speed of 100 nano-seconds or less in pull-up (OFF→ON) or pull-down (ON→OFF) operation can be realized by the circuit shown in FIGS. 2 and 2A, whereas the switching speed of the operation by the prior art circuit shown in FIG. 1 is low such as about 1000 nano-seconds (1 μs).

What is claimed is:

1. A semiconductor integrated circuit comprising a reference voltage line for supplying a reference voltage, a first power supply line for supplying a first voltage, a second power supply line for supplying a second voltage higher voltage level than said first voltage from said reference voltage, a first circuit connected between said first power supply voltage line and said reference voltage line so as to be driven by the voltage difference between said first voltage and said reference voltage, a second circuit connected between said second power supply voltage line and said reference voltage line so as to be driven by the voltage difference between said second voltage and said reference voltage, means for supplying a signal from said first circuit to said second circuit, and means for outputting a signal from said second circuit; said second circuit including a plurality of first insulated gate field effect transistors each having source and drain regions, a first gate insulating film and a gate electrode to which said signal from said first circuit is applied, a plurality of second insulated gate field effect transistors each having source and drain regions, a second gate insulating film having a thickness thicker than that of said first gate insulating film and a gate electrode, and a node connected to one of said source and drain regions of one of said first transistors, to one of said source and drain regions of one of said second transistors and to said means for outputting said signal.

2. A semiconductor integrated circuit of claim 1, in which said reference voltage is a ground voltage and said reference voltage line is a ground line.

3. A semiconductor integrated circuit of claim 1, in which said second circuit includes a signal level converter converting said signal from said first circuit into a signal having a signal level higher than that of said signal from said first circuit.

4. A semiconductor integrated circuit of claim 1, in which said first voltage is 10 volts or less, and said second voltage is 40 volts or more.

5. A semiconductor integrated circuit of claim 1, in which the thickness of said first gate insulating film is 700 angstroms or less, and the thickness of said second gate insulating film is 1500 angstroms or more.

6. A semiconductor integrated circuit comprising a reference voltage line held at a reference voltage, a power supply line for supplying a high voltage, a signal level conversion circuit connected between said power supply line and said reference voltage line so as to be driven by the voltage difference between said high voltage and said reference voltage, first means for sending an input signal of either a low voltage state or a high voltage state into said signal level conversion circuit, and second means for leading out an output signal of either a low voltage state or a high voltage state from said signal level conversion circuit in response to said input signal, said high voltage state in said output signal being higher voltage level than said high voltage state in said input signal, said signal level conversion circuit including a first node, a second node connected to said second means for leading out said output signal, a first insulated gate field effect transistor having a source-drain path connected between said first node and said reference voltage line, a gate insulating film of a first thickness and a gate electrode connected to said first means so as to be applied said input signal, a second insulated gate field effect transistor having a source-drain path connected between said second node and said reference voltage line, a gate insulating film of said first thickness and a gate electrode connected to said first means so as to be applied said input signal, a third insulated gate field effect transistor having a source-drain path connected between said power supply line and said first node, a gate insulating film of a second thickness thicker than said first thickness and a gate electrode, a fourth insulated gate field effect transistor having a source-drain path connected between said power supply line and said second node, a gate insulating film of said second thickness and a gate electrode, means for connecting said first node and said gate electrode of said fourth transistor, and means for connecting said second node and said gate electrode of said third transistor.

7. A semiconductor integrated circuit of claim 6, in which said reference voltage is a ground voltage and said reference voltage line is a ground line.

8. A semiconductor integrated circuit of claim 6, in which said high voltage in said power supply line is 40 volts or more such that said high voltage state in said output signal becomes 40 volts or more, and said high voltage state in said input signal is 10 volts or less.

9. A semiconductor integrated circuit of claim 6, in which said first thickness of said gate insulating film of each of said first and second transistors is 700 angstroms or less, and said second thickness of said gate insulating film of each of said third and fourth transistors is 1500 angstroms or more.

10. A semiconductor integrated circuit of claim 6, in which said voltage in said power supply line is of positive and said reference voltage is ground voltage such that said high voltage state in said output signal becomes a positive voltage and said low voltage state in said output signal becomes substantially ground voltage.

11. A semiconductor integrated circuit of claim 10, in which said first and second transistors are N-channel type transistors, and said third and fourth transistors are P-channel type transistors.

12. A semiconductor integrated circuit comprising a reference voltage line for supplying a reference voltage, a first power supply line for supplying a first voltage, a second power supply line for supplying a second voltage higher voltage level than said first voltage from said reference voltage, a circuit connected between said first power supply voltage line and said reference voltage line so as to be driven by the voltage difference between said first voltage and said reference voltage, a first node, a second node, an output node, a first insulated gate field effect transistor having a source-drain path connected between said first node and said reference voltage line, a gate insulating film and a gate electrode, a second insulated gate field effect transistor having a source-drain path connected between said second node and said reference voltage line, a gate insulating film and a gate electrode, a third insulated gate field effect transistor having a source-drain path connected between said output node and said reference voltage line, a gate insulating film and a gate electrode, a fourth insulated gate field effect transistor having a source-drain path connected between said second power supply line and said first node, a gate insulating film thickner than that of said gate insulating film of respective said first to third transistors and a gate electrode, a fifth insulated gate field effect transistor having a source-drain path connected between said second power supply line and said second node, a gate insulating film thicker than that of said gate insulating film of respective said first to third transistors and a gate electrode, a sixth insulated gate field effect transistor having a source-drain path connected between said second power supply line and said output node, a gate insulating film thicker than that of said gate insulating film of respective said first to third transistors and a gate electrode, a first means for connecting said first node and said gate electrode of said fifth transistor, a second means for connecting said second node and said gate electrode of said fourth transistor, a third means for connecting said second node and said gate electrode of said sixth transistor, a fourth means for outputting an output signal from said output node, a fifth means for supplying a first signal from said circuit to said gate electrode of said first transistor, a sixth means for supplying said first signal from said circuit to said gate electrode of said third transistor, and a seventh means for supplying a second signal from said circuit to said gate electrode of second transistor, each of said first and second signals including a high voltage state and a low voltage state, and said output signal including a high voltage state higher voltage level than said high voltage state in said first and second signals, and a low voltage state.

13. A semiconductor integrated circuit of claim 12, in which said reference voltage is a ground voltage and said reference voltage line is a ground line.

14. A semiconductor integrated circuit of claim 12, in which said first voltage is 10 volts or less, and said second voltage is 40 volts or more.

15. A semiconductor integrated circuit of claim 12, in which said gate insulating film of each of said first, second and third transistor has the thickness of 700 angstroms or less, and said gate insulating film of each of said fourth, fifth and sixth transistors has the thickness of 1500 angstroms or more.

16. A semiconductor integrated circuit of claim 12, in which said first, second, fourth and fifth transistors, said first and second means and said first and second nodes constitute a signal level conversion circuit.

17. A semiconductor integrated circuit of claim 12, in which said first voltage in said first power supply line is of positive and said reference voltage is ground voltage such that said high state in said first and second signals becomes a positive voltage and said low state in said first and second signals becomes the ground voltage or near the ground voltage.

18. A semiconductor integrated circuit of claim 17, in which said second voltage in said second power supply line is of positive.

19. A semiconductor integrated circuit of claim 18, in which said first, second and third transistors are N-channel type transistors, and said fourth, fifth and sixth transistors are P-channel type transistors.

* * * * *